US009484945B1

(12) United States Patent
Wan et al.

(10) Patent No.: US 9,484,945 B1
(45) Date of Patent: Nov. 1, 2016

(54) ASYNCHRONOUS SUCCESSIVE-APPROXIMATION-REGISTER ANALOG-TO-DIGITAL CONVERTER (SAR ADC) IN SYNCHRONIZED SYSTEM

(71) Applicant: Hong Kong Applied Science & Technology Research Institute Company Limited, Hong Kong (HK)

(72) Inventors: Ho Ming (Karen) Wan, Hong Kong (HK); Kwai Chi Chan, Hong Kong (HK); Tin Ho (Andy) Wu, Hong Kong (HK)

(73) Assignee: Hong Kong Applied Science and Technology Research Institute Company, Limited, Hong Kong (HK)

( * ) Notice: Subject to any disclaimer, the term of this patent is extended or adjusted under 35 U.S.C. 154(b) by 0 days.

(21) Appl. No.: 15/146,890

(22) Filed: May 5, 2016

(51) Int. Cl.
*H03M 1/06* (2006.01)
*H03M 1/46* (2006.01)
*H03M 1/12* (2006.01)

(52) U.S. Cl.
CPC ............ *H03M 1/46* (2013.01); *H03M 1/06* (2013.01); *H03M 1/1245* (2013.01)

(58) Field of Classification Search
CPC ...... H03M 1/46; H03M 1/06; H03M 1/1245; H03M 1/38; H03M 1/0682; H03M 1/125; H03M 1/466
USPC .................................. 341/118, 155, 161, 156
See application file for complete search history.

(56) References Cited

U.S. PATENT DOCUMENTS

| 8,872,691 | B1 | 10/2014 | Stepanovic | |
| 8,896,476 | B2 * | 11/2014 | Harpe | H03M 1/02 341/118 |
| 8,957,802 | B1 * | 2/2015 | Evans | H03M 1/0863 341/155 |
| 9,258,008 | B2 | 2/2016 | Singh et al. | |
| 9,337,859 | B2 * | 5/2016 | Chen | H03M 1/38 |
| 2016/0006450 | A1 | 1/2016 | Chen et al. | |

OTHER PUBLICATIONS

Cho et al., "A Two-Channel Asynchronous SAR ADC with Metastable-Then-Set Algorithm", IEEE Transaction on Very Large Scale Integration (VLSI) Systems, vol. 20, No. 4, Apr. 2012, pp. 765-769.
Yan et al., "A 0.6-V 8.3-ENOB asynchronous SAR ADC for biomedical applications", J of Semiconductors, vol. 35, No. 8, Aug. 2014.

* cited by examiner

*Primary Examiner* — Jean B Jeanglaude
(74) *Attorney, Agent, or Firm* — Stuart T. Auvinen; gPatent LLC

(57) ABSTRACT

A correcting asynchronous Successive-Approximation Register (SAR) analog-to-digital converter (ADC) detects and corrects metastability errors. An analog signal is synchronously sampled by a system clock, but data bits are converted asynchronously. A valid detector compares true and complement outputs of a comparator that compares the sampled voltage to a DAC voltage generated from digital test value from the SAR. Once the true and complement outputs diverge past logic thresholds, the valid detector activates a VALID signal indicating that comparison is completed. The compare result is then latched in as a data bit and the SAR advances to the next test value. Once all bits have been converted, an End-of-Conversion (EOC) is signaled. If the EOC does not occur by the end of the system clock, a metastability error is detected. The current bit that never finished comparison is forced high and all other unconverted bits are forced low.

20 Claims, 9 Drawing Sheets

ASYNCHRONOUS SUCCESSIVE-APPROXIMATION-REGISTER ANALOG-TO-DIGITAL CONVERTER (SAR ADC) IN SYNCHRONIZED SYSTEM

FIELD OF THE INVENTION

This invention relates to analog-to-digital converters (ADC's), and more particularly to error-correcting Successive-Approximation Register (SAR) ADCs.

BACKGROUND OF THE INVENTION

Various kinds of Analog-to-Digital Converters (ADC's) have been used in a wide variety of applications. Flash ADC's compare analog signal voltages to multiple voltage levels in an instant to produce a multi-bit digital word that represents the analog voltage. Successive-approximation ADC's use a series of stages to convert an analog voltage to digital bits. Each stage compares an analog voltage to a reference voltage, producing one digital bit. Algorithmic, re-circulating, or recycling ADC's use a loop to convert an analog voltage. Digital bits are generated over multiple cycles in the same comparator stage.

FIG. 1 shows a Successive-Approximation-Register ADC. Successive-Approximation-Register SAR 102 receives a clock CLK and contains a register value that is changed to gradually zero-in on a close approximation of the analog input voltage VIN. For example, the value in SAR 102 may first be 0.5, then 0.25, then 0.375, then 0.313, then 0.281, then 0.296, then 0.304, then 0.308, then 0.31, then 0.311, and finally 0.312 when comparing to a VIN of 0.312 volts. SAR 102 outputs the current register value to digital-to-analog converter (DAC) 100, which receives a reference voltage VREF and converts the register value to an analog voltage VDAC.

The input analog voltage VIN is applied to sample-and-hold circuit 104, which samples and holds the value of VIN. For example, a capacitor can be charged by VIN and then the capacitor isolated from VIN to hold the analog voltage. The sampled input voltage from sample-and-hold circuit 104 is applied to the inverting input of comparator 106. The converted analog voltage VDAC is applied to the non-inverting input of comparator 106.

Comparator 106 compares the converted analog voltage VDAC to the sampled input voltage and generates a high output VCOMP when the converted analog voltage VDAC is above the sampled VIN, and the register value in SAR 102 is too high. The register value in SAR 102 can then be reduced.

When the converted analog voltage VDAC is below the sampled input voltage, comparator 106 generates a low output VCOMP to SAR 102. The register value in SAR 102 is too low. The register value in SAR 102 can then be increased for the next cycle.

The register value from SAR 102 is a binary value of N bits, with D(N−1) being the most-significant-bit (MSB) and D0 being the least-significant-bit (LSB). SAR 102 can first set the MSB D(N−1), then compare the converted analog voltage VDAC to the input voltage VIN, then adjust the MSB and/or set the next MSB D(N−2) based on the comparison. The set and compare cycle repeats until after N cycles the LSB is set. After the last cycle, the end-of-cycle EOC signal is activated to signal completion. A state machine or other controller can be used with or included inside SAR 102 to control sequencing.

FIG. 2 is a graph showing a SAR ADC resolving an input voltage. The register value in SAR 102 is initially set to one-half, or 10000. Comparator 106 determines that the input voltage VIN is less than the converted value from SAR 102, so in the next iteration SAR 102 is set to one-quarter, or 01000. Comparator 106 determines that the input voltage VIN is greater than the converted value from SAR 102, so in the third iteration SAR 102 is set to three-eighths, or 01100. Comparator 106 determines that the input voltage VIN is less than the converted value from SAR 102 in the third iteration, so in the fourth iteration SAR 102 is set to five-sixteenths, or 01010. Now comparator 106 determines that the input voltage VIN is greater than the converted value from SAR 102, so in the fifth iteration SAR 102 is set to 9/32, or 01011. The final comparison is that VIN is above the converted value, so the final result is 01011.

FIGS. 3A-C highlight metastability errors in an ADC. An Analog Front-End (AFE) of a receiver or similar circuit may include a SAR-ADC such as shown in FIG. 1 to digitize the received analog signal. One sample may be converted on every rising edge of a sampling clock, which may be synchronized to the SAR clock CLK (FIG. 1). Such a synchronous system can produce a digitized representation of the received signal, such digitized wave 114 shown in FIG. 3C. Two or more ADCs may be connected in parallel to interleave or pipeline conversions and support higher sampling rates.

Low-power systems such as small battery or inductive-powered Radio-Frequency Identification (RFID) tags operate at very high speeds. A synchronous ADC may be used with an over-sampling clock that is a multiple of the system clock. The fixed sample period may require many pulses of the over-sampling clock to perform the many steps in data conversion that are required for each data sample.

Another alternative is an asynchronous ADC that has a variable sampling time. An over-sampling clock may not be needed. However, the variable sampling time can cause noise on voltage references when interleaving is used, resulting in output errors. At some point in the design, an extra timing algorithm or synchronizer is needed to synchronize the asynchronous analog conversions back to the system clock. Metastability problems can occur, especially for small differential inputs.

In FIG. 3A, comparator 108 is a comparator within an ADC, such as comparator 106 in FIG. 1, or perhaps a buffer within a flip-flop or other storage element, such as in Approximation-Register SAR 102. Comparator 108 may have some feedback or exhibit properties of a bi-stable element even when a feedback loop is not explicitly included in its circuit schematic. Differential comparators may exhibit bistable characteristics especially when the two differential inputs are close to each other in value.

In FIG. 3B, a plot of the output voltages of comparator 108 is shown for various input voltages. When the two input voltages VIN+, VIN− are closer together, the outputs require more time to resolve to logic 1 and 0 states, as shown in curve 112, than when a larger input voltage difference VIN+, VIN− is applied, as shown in curve 110.

The comparator time-to-output TCOMP may be specified as the time until logic 1 and 0 are reached by its output under nominal VIN+, VIN− differences, as shown in curve 110. However, when the input voltages are closer together, as shown in curve 112, a time longer than TCOMP is required.

In a synchronous system, the output of comparator 108 must be sampled on a next clock edge. If that clock edge occurs at TCOMP, but the input voltages are as small as in curve 112, then the output is uncertain. A full logic 1 or logic 0 may not be latched in to the next stage. Metastability occurs in the comparator and can propagate downstream as the metastable signal is sampled and propagated through downstream logic and latches.

In asynchronous systems, such metastable signal may occur more often since the conversion time is not defined by a clocked signal. Thus both synchronous and asynchronous systems may suffer from metastability, especially when low power systems use low voltages.

In FIG. 3C, digitized wave 114 contains errors 116 that are caused by metastable events, such as when small voltages are compared. Such errors 116 may be dramatic and seriously alter the perceived digitized waveform. Such errors 116 are undesirable.

While some errors may be present in digitized wave 114, it is desired to reduce the size or magnitude of these errors 116. An ADC that detects metastability errors is desirable. An SAR-ADC that corrects metastability errors is particularly desirable to reduce the size of such errors.

What is desired is an error-detecting and error-correcting Successive-Approximation Register (SAR) analog-to-digital converter (ADC). A SAR-ADC that can reduce the magnitude of metastability errors is desirable.

DETAILED DESCRIPTION

The present invention relates to an improvement in error-correcting SAR-ADCs. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 4:
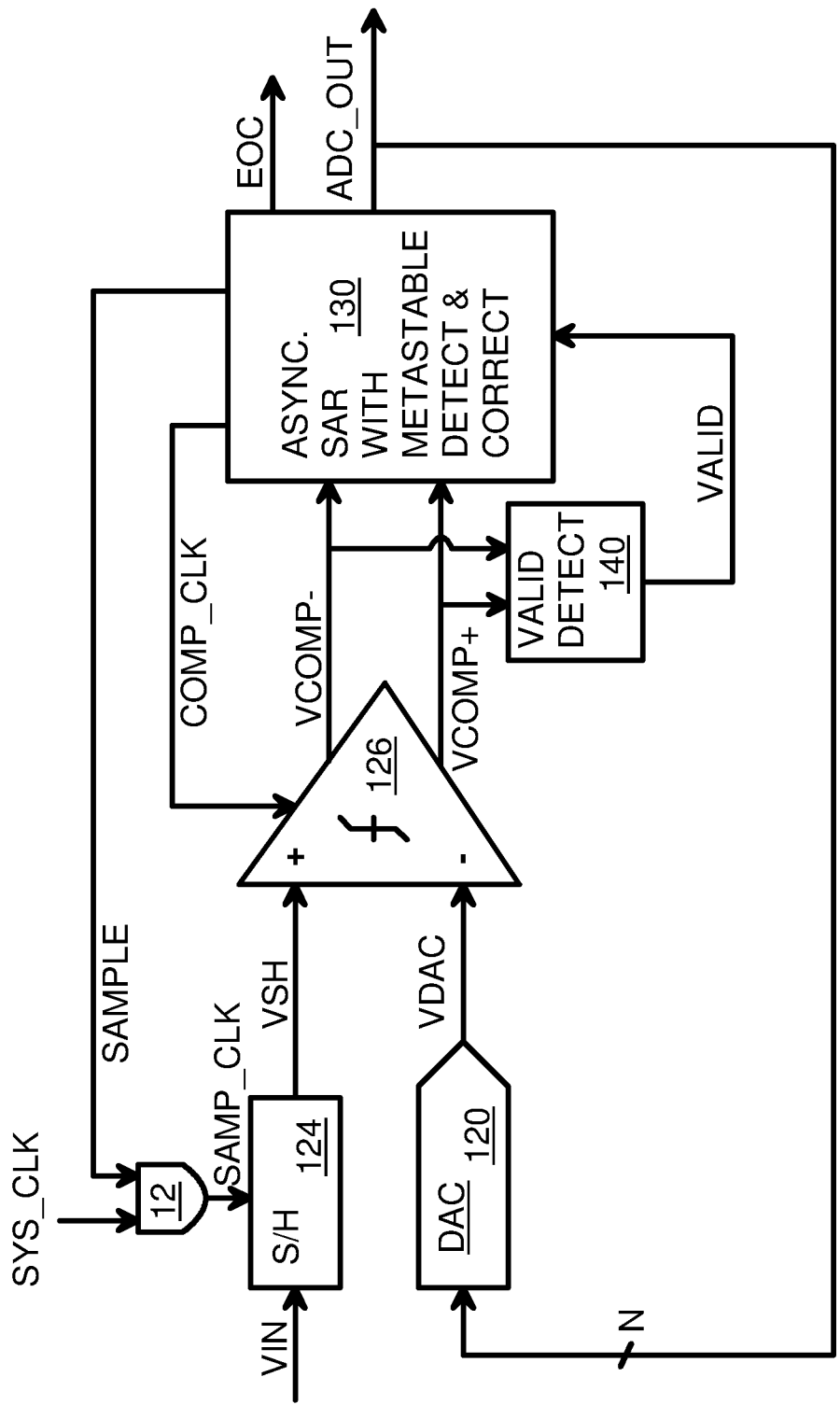
FIG. 4 is a block diagram of an error-correcting SAR-ADC with metastability detection.

FIG. 4 is a block diagram of an error-correcting SAR-ADC with metastability detection. An input voltage VIN is sampled and held by sample and hold 124 to provide sampled voltage VSH to an input to comparator 126. AND gate 12 activates the sampling clock SAMP_CLK when a next sample signal is generated and the system clock SYS_CLK occurs. Thus sampling is synchronized to the system clock. The sampling period and the data capture time are aligned. No extra timing algorithm or hardware is required to synchronize the input and output with the system clock.

Figure 1:
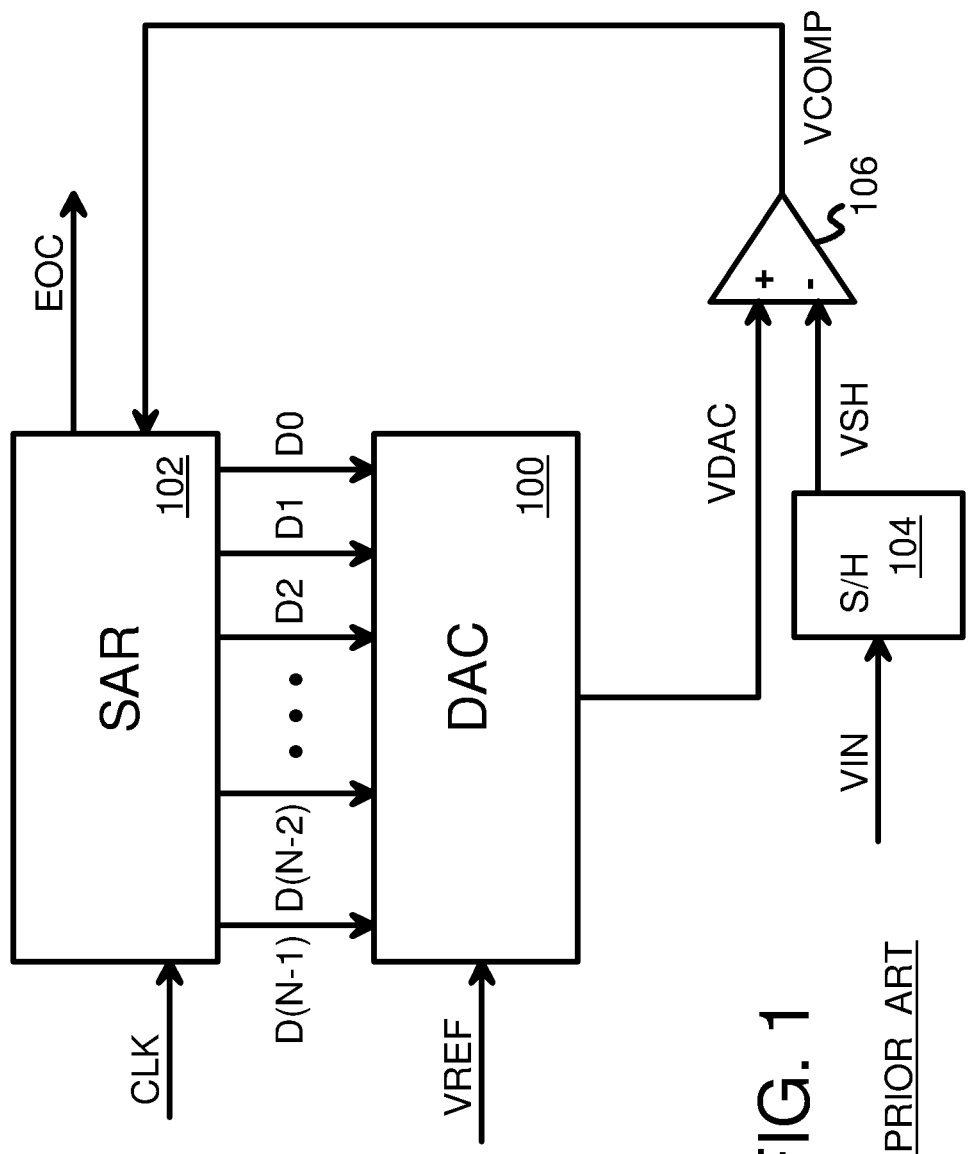
FIG. 1 shows a Successive-Approximation-Register ADC.
Figure 2:
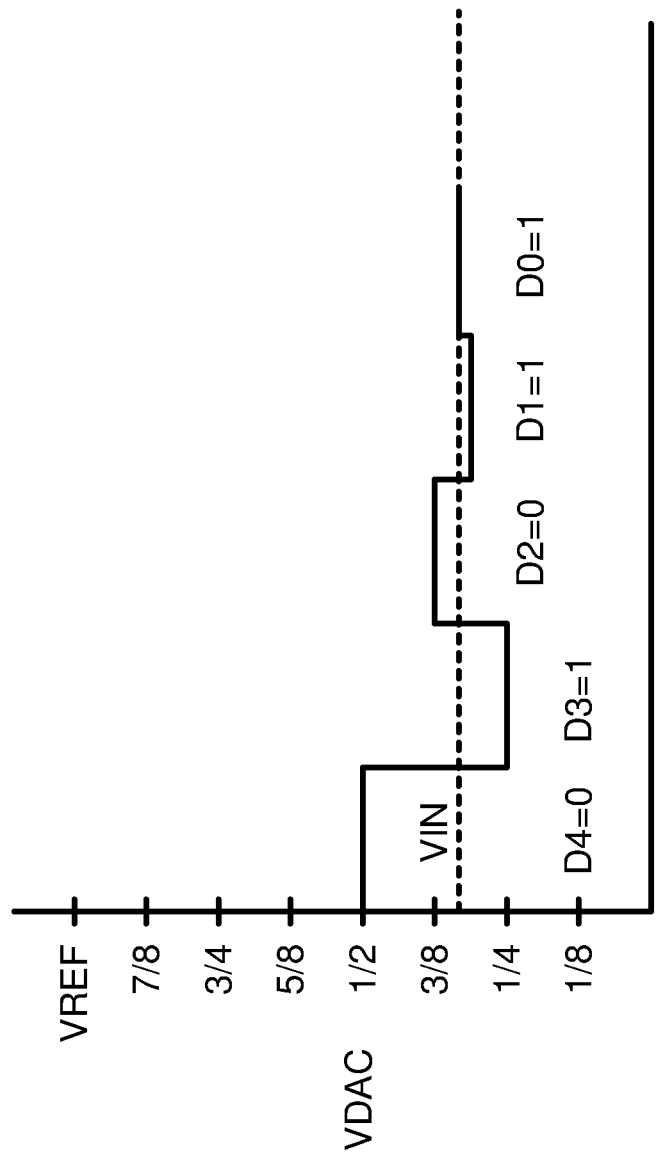
FIG. 2 is a graph showing a SAR ADC resolving an input voltage.
Figure 3C:
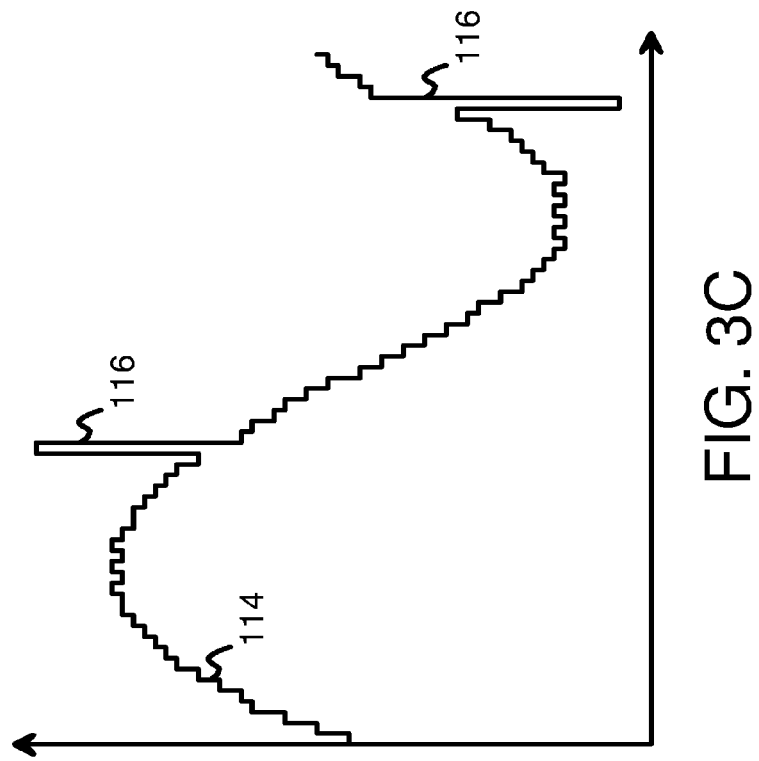
FIGS. 3A-C highlight metastability errors in an ADC.
Figure 3A:
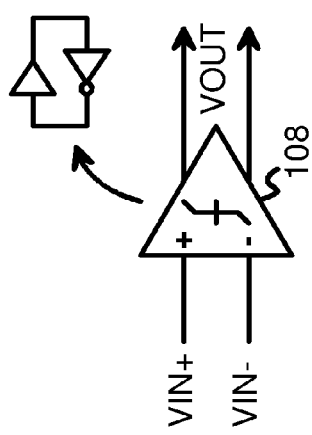
Figure 3B:
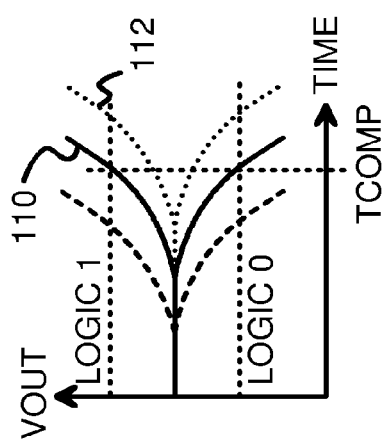

DAC 120 generates an analog voltage VDAC from an N-Bit digital value ADC_OUT that is generated by the Successive-Approximation Register (SAR) in correcting asynchronous SAR 130. Successive digital values are tested during conversion as shown in FIG. 2 to converge on the final digital value for a sample cycle.

Comparator 126 compares VDAC from DAC 120 to sampled voltage VSH to generate a differential compare result VCOMP+, VCOMP−. The compare results VCOMP+, VCOMP− are used by correcting asynchronous SAR 130 to determine if the current digital bit should be a 1 or a 0, and to then adjust the N digital bits for the test the next bit during conversion and adjust VDAC using DAC 120.

Correcting asynchronous SAR 130 generates a control signal to comparator 126. Compare clock COMP_CLK activates comparator 126 to compare its inputs and generate its outputs.

Valid detector 140 compares the differential compare results VCOMP+, VCOMP− from comparator 126 to generate valid signal VALID. When VCOMP+, VCOMP− are close to each other in voltage, valid detector 140 de-asserts VALID Once VCOMP+ and VCOMP− diverge from each other by a sufficient amount, valid detector 140 drives VALID high. For example, valid detector 140 could wait until full logic 1 and logic 0 voltage levels are reached by VCOMP+, VCOMP−, or could wait until a pre-determined voltage difference occurs, such as 0.1 volt, or could have the voltage difference required set by process, supply voltage, temperature, and other operating conditions to track other circuits.

Valid detector 140 generates one VALID pulse for each digital bit that is successfully converted. Correcting asynchronous SAR 130 counts the number of VALID signals. Once the number of VALID signals equals the number of bits N to be converted, correcting asynchronous SAR 130 asserts an End-of-Conversion EOC signal. The EOC signal indicates that the full N-bit value was converted successfully.

When the next system clock edge SYS_CLK arrives but EOC has not yet been generated, an error is detected. During one of the N bits being converted, comparator 126 became metastable and was not able to drive its VCOMP+, VCOMP− result outputs to high and low levels. Conversion of the LSB's never occurred, since correcting asynchronous SAR 130 was waiting for the VALID signal from valid detector 140 before moving to the next digital bit.

Correcting asynchronous SAR 130 contains correction logic that implements the procedure shown later in FIG. 9. The upper MSB's that were successfully converted are retained, but the metastable bit that comparator 126 hung on is forced to 1, while the lower bits after the metastable bit are all forced to 0. The metastability error is corrected by forcing the lower bits to 100 . . . 000, which is a value of one-half of the unknown bits. Thus error correction provides an approximation of the unconverted bits. The true value of the lower bits could be 111 . . . 111 or 000 . . . 000 or any value in between, so 100 . . . 000 is half of the range of possible values, or an average of the possible values.

Figure 5:
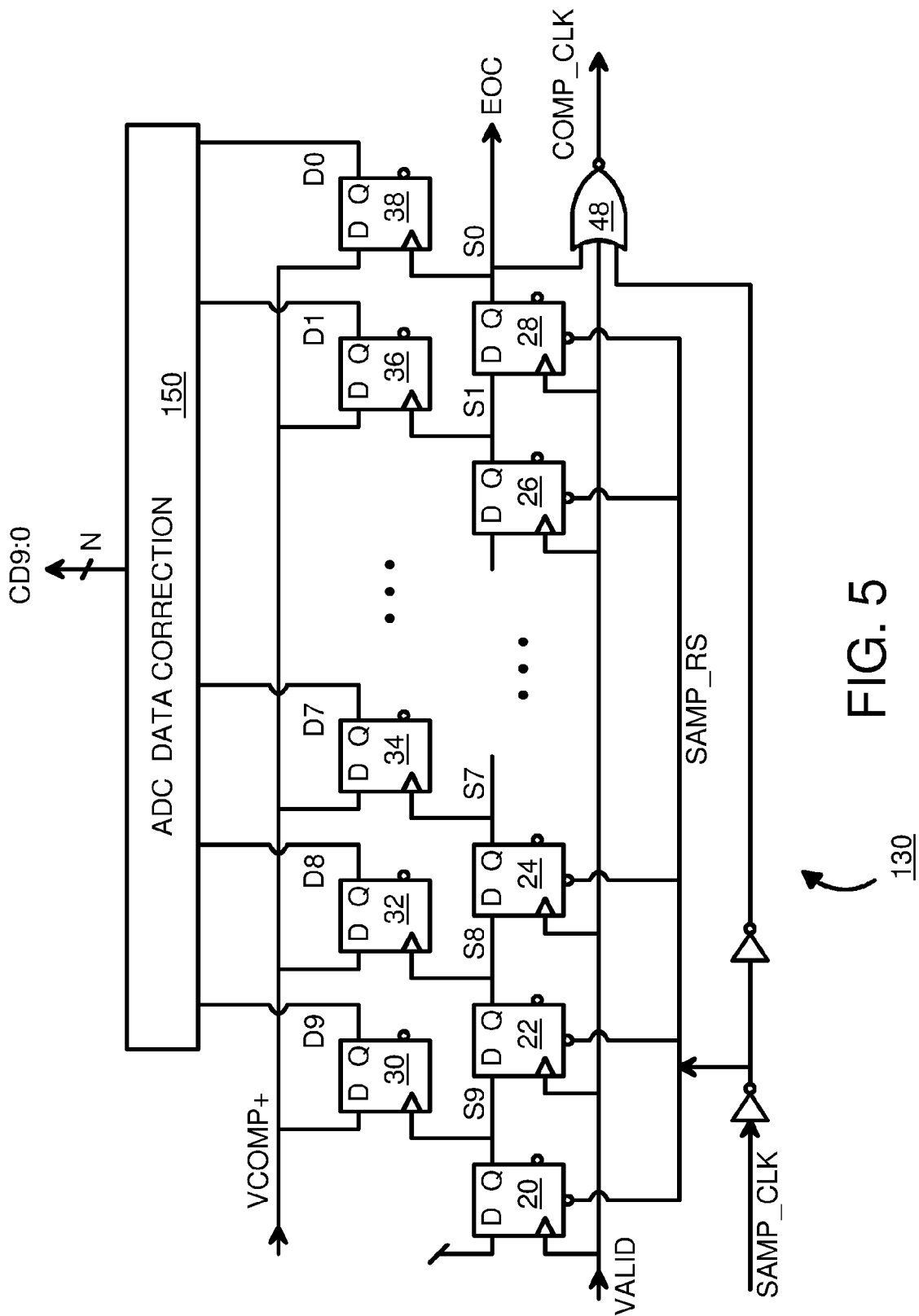
FIG. 5 is a schematic of the correcting asynchronous SAR that detects and corrects metastability errors.

FIG. 5 is a schematic of the correcting asynchronous SAR that detects and corrects metastability errors. The VALID signal generated by valid detector 140 (FIG. 4) is applied to the clock inputs to clock bit-conversion-counting flip-flops 20, 22, 24, . . . 28. Bit-conversion-counting flip-flops 20, 22, 24, . . . 28 are cleared by SAMP_RS which is the inverse of the sampling clock. Thus when the analog input is sampled, bit-conversion-counting flip-flops 20, 22, 24, . . . 28 are all cleared to zero. The D input to first bit-conversion-counting flip-flop 20 is tied high while the other D inputs receive the Q outputs of the prior flip-flop in the chain of bit-conversion-counting flip-flops 20, 22, 24, . . . 28. Ones are shifted in from the left into bit-conversion-counting flip-flops 20, 22, 24, . . . 28 for each VALID received. Thus bit-conversion-counting flip-flops 20, 22, 24, . . . 28 store a count of the number of valid bits converted for the current sample, as a thermometer code.

For a 10-bit ADC, the Q output of bit-conversion-counting flip-flop 20 is S9, being a 1 when bit D9 has been converted. The Q output of bit-conversion-counting flip-flop 22 is S8, being a 1 when bit D8 has been converted. Similarly, the Q output of bit-conversion-counting flip-flop 24 is S7, being a 1 when bit D7 has been converted. Once all 10 bits have been converted, and 10 VALID pulses received, the Q output of final bit-conversion-counting flip-flop 28 goes high, signaling that D0 has been converted. This final Q output is S0 and is also EOC, indicating that the end of conversion has been reached since all 10 bits have now been converted.

Each of the Q outputs of bit-conversion-counting flip-flops 20, 22, 24, . . . 28, S9 to S0, is applied to the clock input of one of compare result flip-flops 30, 32, 34, . . . 38. The D inputs of compare result flip-flops 30, 32, 34, . . . 38 receive the non-inverting compare output of comparator 126, VCOMP+.

When the MSB is being converted, S9 to S0 are all low. Once valid detector 140 detects valid data from comparator 126, VALID pulses high and first bit-conversion-counting flip-flop 20 is clocked and S9 changes from low to high. S8 to S0 remain low. The high-going S9 clocks first compare result flip-flop 30, causing the value of VCOMP+ on its D input to be stored into first compare result flip-flop 30 as D9, the MSB.

Then correcting asynchronous SAR 130 can adjust the output of DAC 120 to compare the next data bit, D8. S9 is high but S8 to S0 are all low. Once valid detector 140 detects valid data from comparator 126, VALID pulses high a second time and second bit-conversion-counting flip-flop 22 is clocked and S8 changes from low to high. S9 remains high and S7 to S0 remain low. The high-going S8 clocks second compare result flip-flop 32, causing the value of VCOMP+ on its D input to be stored into second compare result flip-flop 32 as D8, the second MSB. Then correcting asynchronous SAR 130 can adjust the output of DAC 120 to compare the third data bit, D7. This process continues as successive bits are captured into successive compare result flip-flops 30, 32, 34, . . . 38 until all 10 bits are converted and stored.

When no error occurs, data corrector 150 can pass data D9:0 through without change. Data D9:0 from compare result flip-flops 30, 32, 34, . . . 38 are passed through to the corrected data outputs CD9:0. Alternately, a mux (not shown) can select D9:0 rather than CD9:0.

When a metastability error occurs, VALID is not generated for the bit causing metastability. Conversion halts. At the end of the system clock, if EOC is still low, some of the bits were not converted. Then data corrector 150 is activated to generate corrected data CD9:0 from raw data D9:0 using S9:0 to detect where the metastability occurred.

Figure 9:
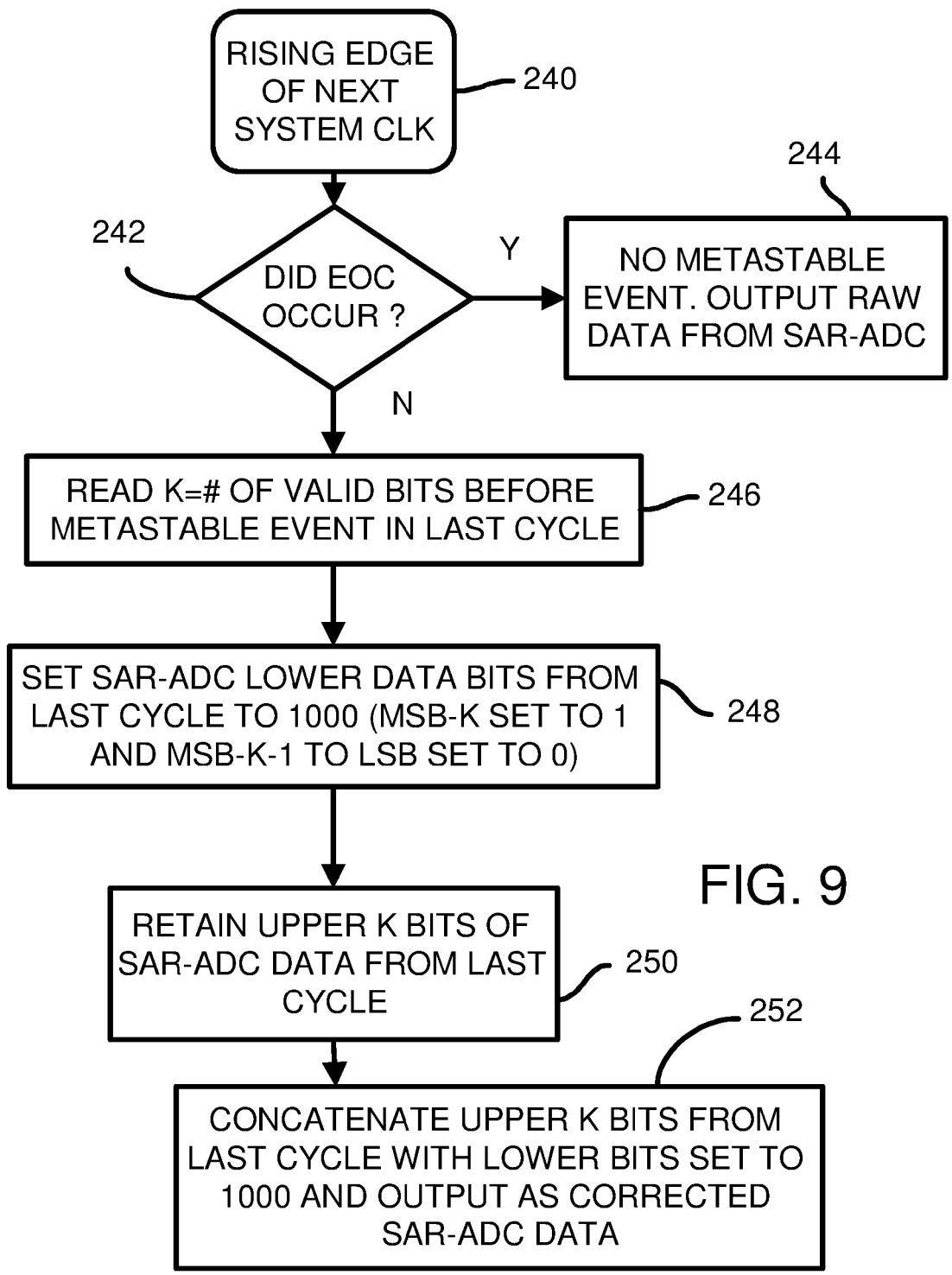
FIG. 9 is a flowchart of error correction at the end of each system clock cycle.

Corrected data is generated as shown in FIG. 9. The location of the last good data is found by examining status bits S9:0. Bits S9:0 that are one have been converted successfully and can be passed through unchanged to the corrected output. However, the first or left-most (most-significant) status bit that is a zero is the bit that went metastable. This metastability location has its data forced to a one. Then all remaining LSB's after the metastability location are forced to zero by data corrector 150. Data corrector 150 can be a combinatorial logic block.

Correcting asynchronous SAR 130 can also generate a COMP_CLK timing signal. NOR gate 48 drives COMP_CLK high when VALID is low, the sampling clock is low, and EOC is low. COMP_CLK is the control signal to comparator 126. This control signal pulses high when sampling is completed and before the end of conversion EOC is reached, pulsing high when VALID is off and comparator 126 should be on, and pulsing low with VALID once each bit's conversion is done.

Figure 6:
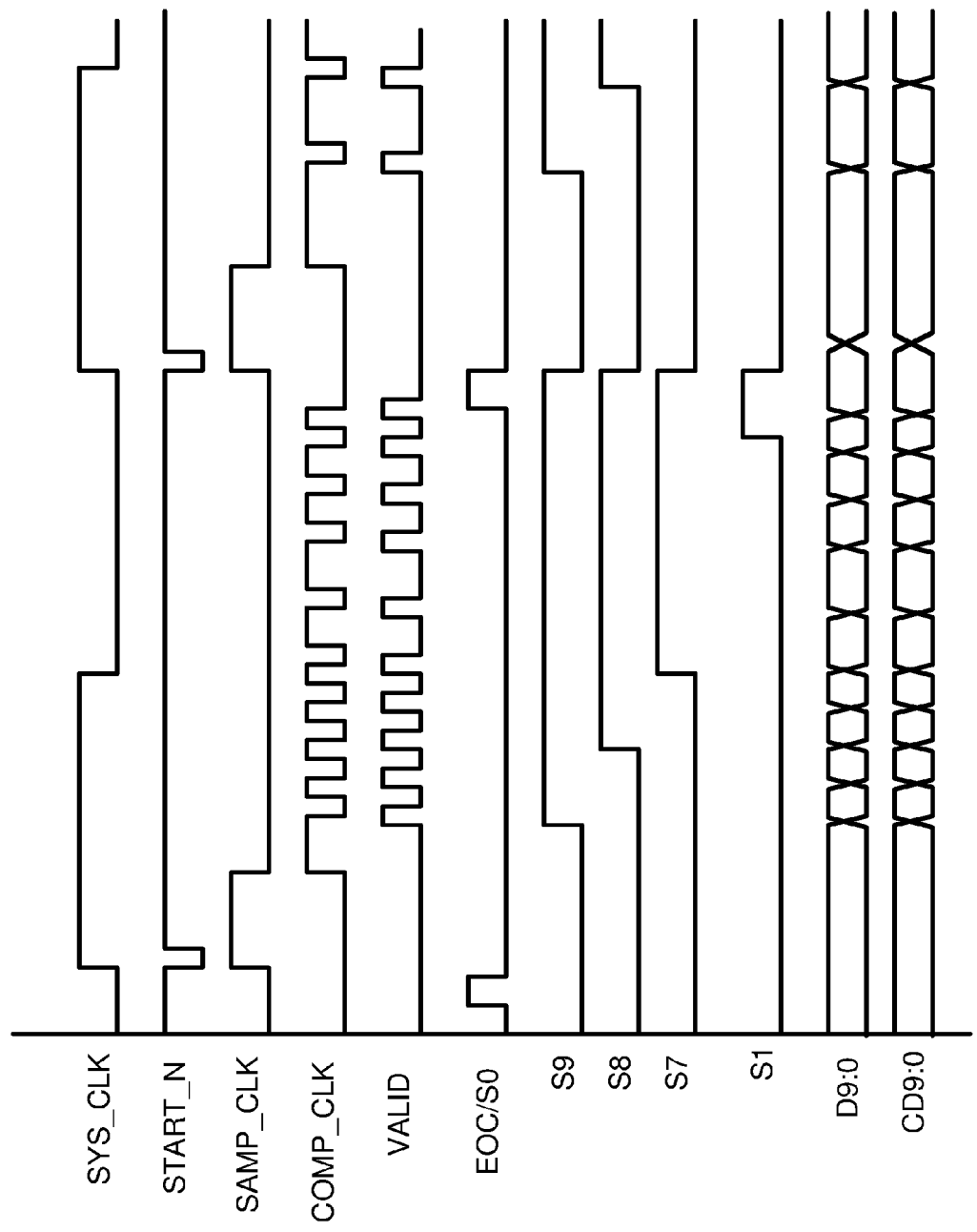
FIG. 6 is a timing diagram of data conversion using the correcting asynchronous SAR when no metastability occurs.

FIG. 6 is a timing diagram of data conversion using the correcting asynchronous SAR when no metastability occurs. A start signal START_N is pulsed low at the start of every system clock SYS_CLK cycle. The sample clock SAMP_CLK pulses high at the start of every system clock cycle to capture the analog signal into sample-and-hold 124 (FIG. 2). One analog sample is captured and converted into a 10-bit digital value for every system clock.

The comparator clock COMP_CLK is driven high once sampling is done, and pulses low for each VALID generated by valid detector 140. Once all 10 bits have been converted, EOC goes high and COMP_CLK is prevented from pulsing high until the next system clock cycle. COMP_CLK turns on comparator 126 to compare the sampled analog value to the current VDAC generated in response to a current N-bit test value from correcting asynchronous SAR 130.

Once comparator 126 has had sufficient time to resolve the voltage difference on its inputs, it drives its outputs high or low. Valid detector 140 detects when the comparator outputs have reached a logic threshold to be readable as valid data. The amount of time required to reach the logic threshold varies. When the voltage differences on the inputs are very small, a longer time may be needed. The time is very data-dependent, but tends to increase for the LSB's. Eventually, VALID is generated, and one of the status bits is clocked and goes high; first S9, then S8, then S7, etc. Finally S1 and then S0 goes high. S0 and EOC can be the same signal.

As each VALID occurs, the data generated by comparator 126, VCOMP+, is latched into one of compare result flip-flops 30, 32, 34, . . . 38. The raw data D9:0 is captured bit by bit as each VALID occurs. Since no error occurs, the raw data D9:0 is passed through as the corrected data CD9:0.

Data corrector 150 can continuously operate on its inputs, changing as each additional data bit and status bit are generated during conversion. Once the last data bit is converted, the last VALID occurs and EOC is signaled. As long as EOC occurs before the next rising edge of SYS_CLK, no error is signaled. However, if EOC remains low at the next system clock rising edge, an error is signaled and the corrected data from data corrector 150 is used. If data corrector 150 is allowed to continuously adjust its outputs as more and more data is converted, it will be ready to output the corrected data at the rising edge of SYS_CLK. A slight delay in latching the current data could also be added to give data corrector 150 a little more time before corrected data is needed.

Figure 7:
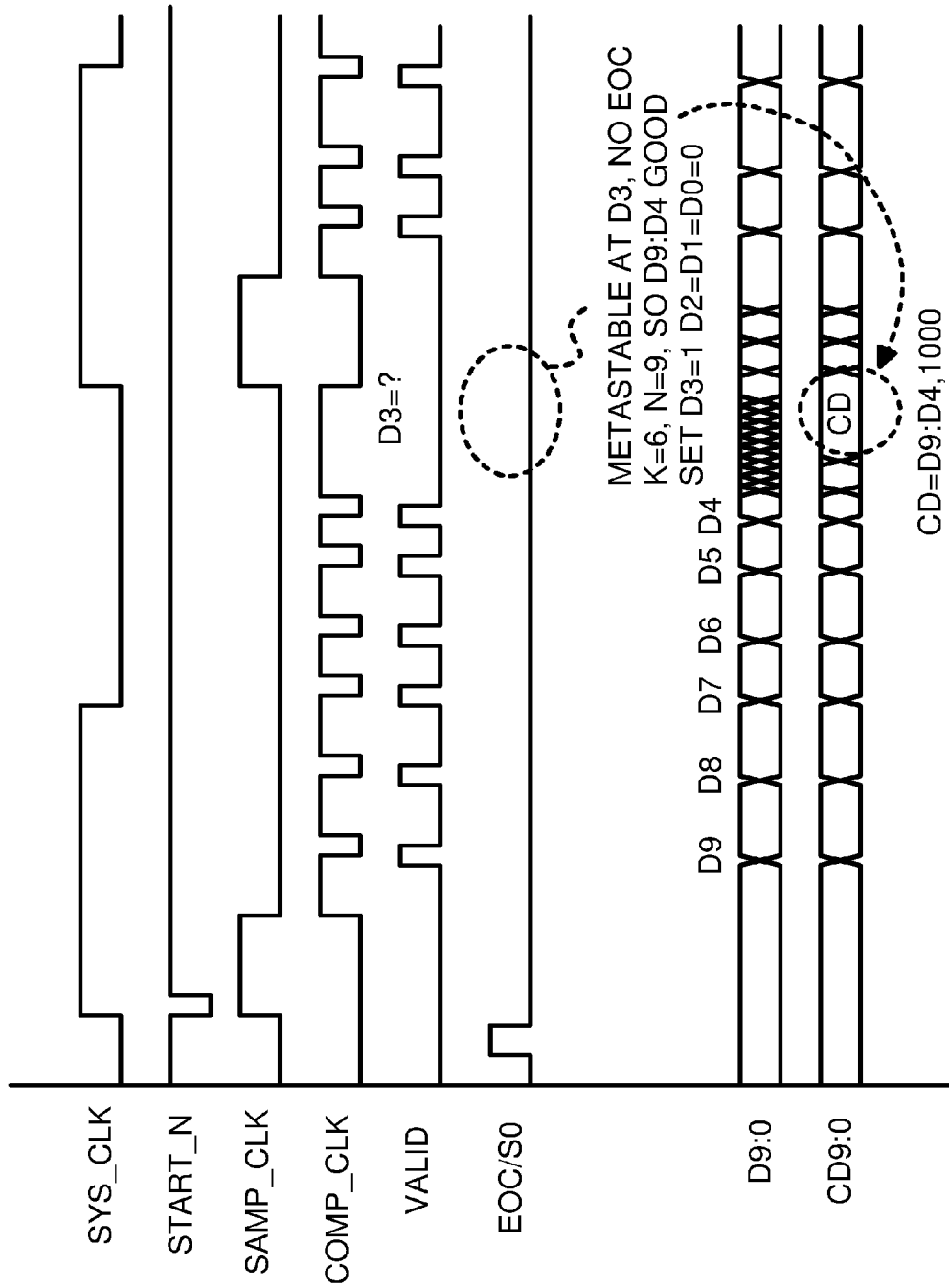
FIG. 7 is a timing diagram of data conversion using the correcting asynchronous SAR when metastability occurs.

FIG. 7 is a timing diagram of data conversion using the correcting asynchronous SAR when metastability occurs. On the rising edge of the system clock, the analog voltage is sampled. Once SAMP_CLK goes low, COMP_CLK goes high to enable comparator 126. After a short amount of time, VALID goes high as the MSB has been converted. D9 is latched. Then COMP_CLK goes high a second time and D8 is converted and stored. Additional COMP_CLK and VALID pulses occur to convert D7, D6, D5, and D4.

However, when COMP_CLK goes high so that comparator 126 can convert D3, no VALID pulse is generated before the next rising edge of the system clock. A metastable event has occurred within comparator 126. The VCOMP+, VCOMP− outputs of comparator 126 have stayed near their midpoint and have not converged to high and low logic states.

Data corrector 150 generates corrected data based on the most recent inputs of the status bits and raw data bits. K is 6 since 6 VALID pulses have been generated and 6 data bits have been successfully converted, D9 to D4.

The status bits have ones for S9 to S4, but zeros for S3 to S0. Since S3 is the left-most zero, the metastability bit is D3. Data corrector 150 passes the raw data bits D9 to D4 through unchanged, but forces CD3 to 1 and forces CD2, CD1, and CD0 to 0.

When the next rising edge of the system clock SYS_CLK occurs, EOC is low so an error is signaled. The corrected data CD9:0 generated by data corrector 150 is latched rather than the raw data from bit-conversion-counting flip-flops 20, 22, 24, . . . 28. The next analog voltage is sampled by SAMP_CLK and then converted to data in this next cycle.

Figure 8:
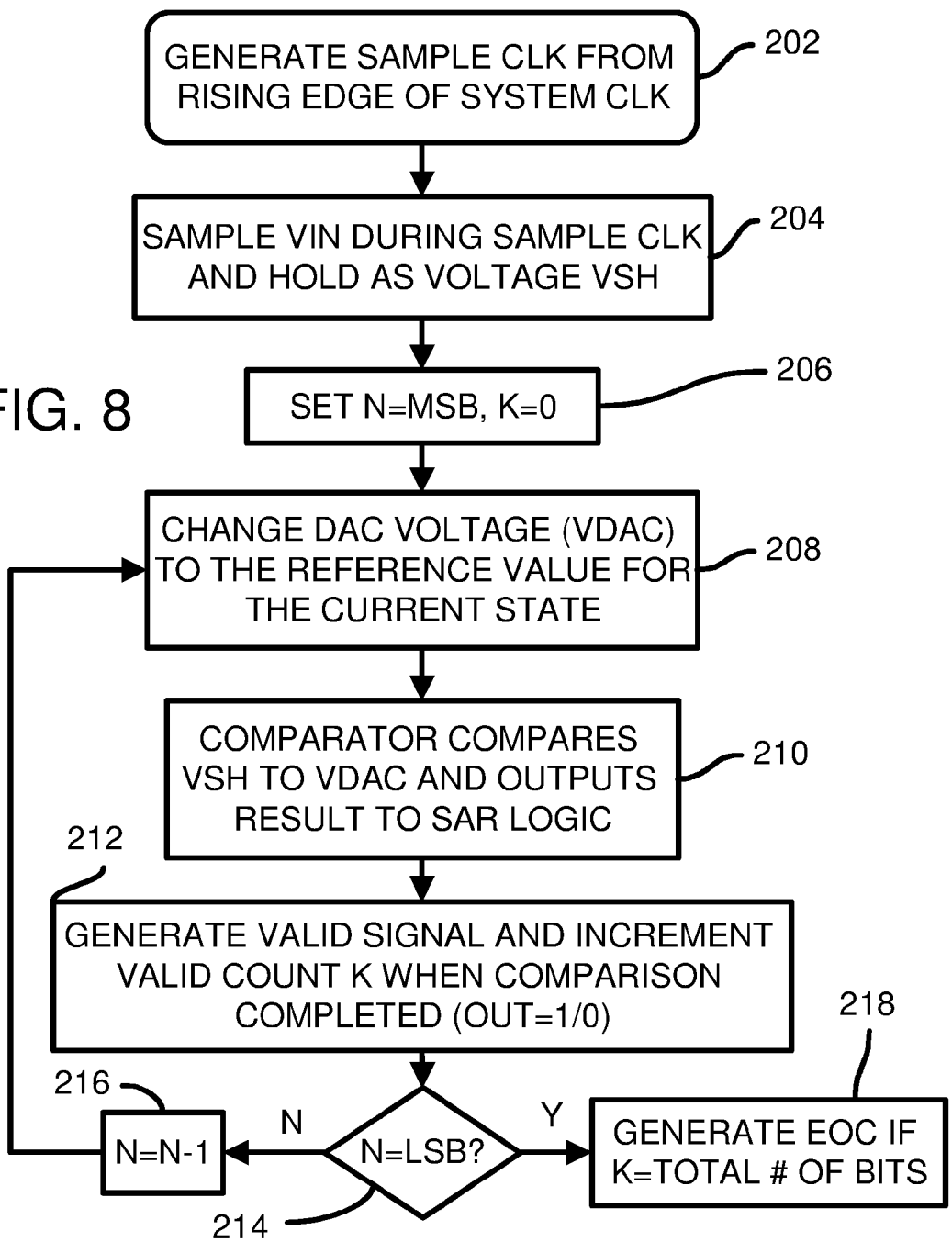
FIG. 8 is a flowchart of data sampling and conversion during each system clock period.

FIG. 8 is a flowchart of data sampling and conversion during each system clock period. This process is repeated for each system clock. When the next rising edge of the system clock occurs, this process stops at whatever step it was in and resets to the first step 202. Thus the process is synchronized to the system clock.

In first step 202, the rising edge of the system clock causes a sample clock to be activated. When this sampling clock is active, step 204, the analog input voltage VIN is sampled and then held by sample-and-hold 124 as sampled voltage VSH. Valid counter K is cleared to zero and index variable N is set to the MSB, such as 9 for a 10-bit ADC, step 206.

Correcting asynchronous SAR 130 generates a N-bit digital value to test, such as 1000000000. This test value is applied to DAC 120 to generate the DAC voltage VDAC, step 208. Once the sampling clock ends and COMP_CLK goes high, comparator 126 turns on and compares VDAC to VSH, step 210. The compare result is output to correcting asynchronous SAR 130 to be stored in bit-conversion-counting flip-flops 20, 22, 24, . . . 28 once valid detector 140 generates VALID generated. When the VALID is generated, step 212, valid counter K is incremented, and the data compare result is stored as raw data.

When the LSB has been reached, step 214, the End-of-Conversion EOC signal is generated, step 218. Valid counter K is now equal to the number of bits to be converted, N (or N+1 is the LSB is considered to be bit 0).

When the LSB has not yet been reached, step 214, the index variable N is reduced by one, step 216, and then next bit is converted, looping back to step 208. If the next edge of the system clock occurs before the process reaches step 218, then EOC is not generated and a metastability error is detected. The process resets to step 202 when the next edge of system clock occurs, regardless of the current step in progress.

FIG. 9 is a flowchart of error correction at the end of each system clock cycle. When the rising edge of the system clock occurs, step 240, this process starts. When EOC is high, step 242, the end of conversion occurred before the end of the last cycle, No metastable event occurred, so the raw data D9:0 is output, step 244.

When EOC is low, step 242, conversion did not successfully complete within the last system clock cycle. A metastability event occurred. Some of the data is in error and unreliable.

The valid counter K is read, such as by finding the left-most zero in bit-conversion-counting flip-flops 20, 22, 24, . . . 28. K is the number of valid bits that were converted successfully, step 246, or the number of VALID pulses. Data corrector 150 forces the left-most un-converted bit, the metastability bit at (MSB-K), high (to a 1) and all the remaining LSB bits to zeros. Thus the un-converted bits are forced to 100 . . . 00, step 248.

The upper K bits that were successfully converted are retained, step 250. Data corrector 150 concatenates the upper K raw data bits with the lower bits forced to 1000 . . . 00 to form the corrected data, step 252.

The data bits that were successfully converted are retained, but the metastable and unknown bits are forced into a known state. The known state is chosen to be half of the range of possible values.

ALTERNATE EMBODIMENTS

Several other embodiments are contemplated by the inventors. For example clocks and other signals may be gated, disabled, powered-down, buffered, delayed, or otherwise altered. The system may be useful for various applications, such as RF sampling systems, BLE, WIFI, RFID tags, System-on-Chip (SoC) data capturing interfaces such as for memory, video or audio data, and multi-channel time-interleaved ADC. References such as bandgap references may be used in the DAC. While analog voltage sensing has been described, analog currents may be sensed rather than voltages by passing the analog current through a voltage to develop an analog voltage.

Valid detector 140 could be implemented as an exclusive-OR (XOR) gate. Transistor sizes and ratios could be adjusted to alter voltages that trigger VALID to be generated, or to adjust logic thresholds to trigger points. Hysteresis could be added.

Rather than force the metastable and unknown lower bits to 100 . . . 000, other forced values could be substituted. For example, the lower bits could be forced to all 0's or to all 1's. However, using a mid-point value helps to smooth the digitized curve when errors occur. Using other forced values might increase the complexity and logic delays of data corrector 150, compared to the simple logic of forcing to 100 . . . 000. Another simple implementation is to force the bits to 011 . . . 111.

Rather than use bit-conversion-counting flip-flops 20, 22, 24, . . . 28 to count K, other kinds of counters could be substituted, such as a simple binary counter. A thermometer-code-to-binary logic block could be added to bit-conversion-counting flip-flops 20, 22, 24, . . . 28 to get K in binary format.

The index variables K and N may be adjusted to refer to the LSB as either bit 0 or bit 1, or some other value. Values may be shifted, transformed, or processed in a variety of ways. The comparator clock COMP_CLK is not a real clock but more of an enable signal.

Various kinds of ripple counters or synchronous counters could be substituted. Different sequences of test values could be generated by the SAR and applied to generate VDAC for testing bits during conversion. While D-type flip-flops have been described, other storage elements could be substituted, such as J-K flip-flops, S-R latches, D-type latches, bistables, etc. Various clocking schemes could also be used.

A single-ended or a fully differential ADC may be used. Equalizing switches could be added between true and complementary nodes for reset and equalization. Calibration hardware and routines may be added. ADC's or other logic may be interleaved, and sub-ADC/DAC's may be used or added. Other circuits using switched capacitors may incorporate the invention, such as a switched-capacitor programmable-gain residue amplifier.

The number of bits may be adjusted. For example, a 15 bit ADC could be used, or an 8-bit, or the 10-bit described. A different number of bits could be substituted for a different precision, and the number of bits could be fixed or could be variable.

Both differential and single-ended analog voltages may be converted. A single-ended analog voltage may be applied to one differential input, while a reference voltage is applied to the other differential input. Sample-and-hold 124 can be a circuit, unit, or network of analog switches, capacitors, op amps, and various combinations. State machines, firmware, software, or hardware may be used to control sequencing such as the test digital values from correcting asynchronous SAR 130.

Some embodiments may not use all components. For example, switches and buffers may be added or deleted in some embodiments. Different kinds of switches may be used, such as 2-way switches or 3-way switches. Muxes may be used as switches. Input resistors could be added to VIN or more complex input filters used. Multiple levels of switches may be used, such as 2-way switches for switches, and then an overall switch that connects either VDD or GND to these 2-way switches.

While binary-weighted conversion has been described, other weightings could be substituted, such as decimally-weighted, prime-weighted, or linearly-weighted, or octal-weighted. The digital value could be in these other number systems, such as octal numbers rather than binary numbers.

Inversions may be added by swapping inverting and non-inverting inputs as desired, but do not change the overall function and thus may be considered equivalents. The resistance and capacitance values may vary in different patterns. Capacitors, resistors, and other filter elements may be added. Switches could be n-channel transistors, p-channel transistors, or transmission gates with parallel n-channel and p-channel transistors, or more complex circuits, either passive or active, amplifying or non-amplifying.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes. Capacitors may be connected together in parallel to create larger capacitors that have the same fringing or perimeter effects across several capacitor sizes.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A metastability-correcting asynchronous Successive-Approximation Register (SAR) Analog-to-Digital Converter (ADC) comprising:

an analog input for receiving an analog signal for conversion to a digital value that represents the analog signal;

a sample-and-hold circuit for sampling the analog signal to generate a sampled signal;

a Successive-Approximation Register (SAR) for storing and adjusting a digital test value;

a Digital-to-Analog Converter (DAC) that receives a sequence of the digital test value from the SAR and generates a DAC voltage represented by the digital test value;

a comparator that compares the DAC voltage to the sampled signal to generate a compare result;

a valid detector that generates a valid signal when the compare result has reached a valid logic state, the valid detector withholding generation of the valid signal when the comparator has a metastable event and the compare result is metastable and has not yet reached the valid logic state;

a bit-conversion-counter that generates a valid count by counting a number of valid signals generated during each system clock period;

an end of conversion signal generated by the bit-conversion-counter when the valid count equals a number of bits to be converted;

a raw data register in the SAR that captures the compare result from the comparator when the valid signal is generated, wherein the compare result is captured as successive raw data bits for each successive valid signal generated; and a data corrector that generates corrected data from the raw data and the valid count, the data corrector outputting raw data from the raw data register for bits captured by valid signals, and concatenating with forced data values for bits not receiving a valid signal;

wherein when the end of conversion signal has been generated when a next system clock period starts, raw data from the raw data register is output as the digital value representing the analog signal;

wherein when the end of conversion signal has not been generated when the next system clock period starts, corrected data from the data corrector is output as the digital value representing the analog signal.

2. The metastability-correcting asynchronous SAR ADC of claim 1
wherein the bit-conversion-counter is clocked by the valid signal and is cleared but not clocked by a system clock;
wherein the valid count is incremented asynchronously to the system clock and the end of conversion signal is generated asynchronously to the system clock.

3. The metastability-correcting asynchronous SAR ADC of claim 1 wherein the number of bits to be converted is at least 8 bits.

4. The metastability-correcting asynchronous SAR ADC of claim 3 further comprising:
a system clock;
wherein the sample-and-hold circuit samples the analog signal in response to the system clock or a derivative of the system clock, wherein the sampled signal is synchronized to the system clock.

5. The metastability-correcting asynchronous SAR ADC of claim 4 wherein the valid detector is an exclusive-OR (XOR) gate that receives a true compare result and a complement compare result from the comparator, the true compare result and the complement compare result being a differential signal output.

6. The metastability-correcting asynchronous SAR ADC of claim 1 further comprising:
control logic that activates a comparator enable signal to enable the comparator when the valid signal is not active, sampling has completed, and the end of conversion signal has not yet been generated in a system clock period;
wherein the control logic pulses off the comparator enable signal for every valid signal generated by the valid detector.

7. The metastability-correcting asynchronous SAR ADC of claim 1 wherein the forced data values comprises a midpoint value near a middle of a range of all possible values of unconverted bits that did not receive a valid signal.

8. The metastability-correcting asynchronous SAR ADC of claim 1 wherein the forced data value is a one for a most-significant unconverted bit that did not receive a valid signal, followed by zeros for all other less-significant unconverted bits that did not receive a valid signal.

9. The metastability-correcting asynchronous SAR ADC of claim 1 wherein the bit-conversion-counter comprises:
a plurality of bit-conversion-counting flip-flops each cleared by a sampling clock synchronized to the system clock period and clocked by the valid signal, wherein the plurality of bit-conversion-counting flip-flops are in a series with a first D-input being connected to a high signal and successive bit-conversion-counting flip-flops having D inputs connected to a Q output of a prior bit-conversion-counting flip-flop;
wherein the end of conversion signal is a Q output or generated from the Q output of a final bit-conversion-counting flip-flop in the plurality of bit-conversion-counting flip-flops.

10. The metastability-correcting asynchronous SAR ADC of claim 9 wherein the raw data register comprises:
a plurality of compare result flip-flops each having a D input receiving the compare result from the comparator, and each being clocked by a Q output from a corresponding one of the plurality of bit-conversion-counting flip-flops;
wherein successive ones of the plurality of compare result flip-flops are successively clocked by corresponding ones of the plurality of bit-conversion-counting flip-flops when each valid signal is received.

11. A method of detecting and correcting metastability errors when operating an Analog-to-Digital Converter (ADC) comprising:
at a start of a system clock cycle, sampling and holding an analog signal to generate a sampled signal;
resetting a valid counter;
generating a sequence of test digital values and applying the test digital values to a Digital-to-Analog Converter (DAC) to generate a DAC voltage;
comparing the DAC voltage to the sampled signal to generate a compare result;
generating a valid signal when the compare result has reached a valid logic state, and withholding generation of the valid signal when the compare result is metastable and has not yet reached the valid logic state;
storing the compare result as a raw data bit in a raw data register for each valid signal generated;
incrementing the valid counter for each valid signal generated;
when the valid counter has reached a terminal count indicating a desired number of bits to convert in the system clock cycle, outputting the raw data bits; and
when the system clock cycle ends and the valid counter has not reached the terminal count indicating the desired number of bits to convert in the system clock cycle, outputting the raw data bits concatenated with forced data bits for unconverted data bits that no valid signal was generated,
whereby unconverted data bits without valid data are replaced with forced data bits to correct metastability errors.

12. The method of claim 11 further comprising:
generating forced data bits by forcing an initial unconverted data bit to a high value and forcing all other following unconverted data bits to zero values;
wherein the initial unconverted data bit is in a bit-position immediately following a bit-position of a raw data bit that received a valid signal, while the other following unconverted data bits have bit-positions that are not adjacent to any bit-position of a raw data bit that received the valid signal.

13. The method of claim 11 further comprising:
generating an end of conversion signal when the valid counter reaches the terminal count;
examining the end of conversion signal at an end of the system clock cycle to determine when a metastability error has occurred and using corrected data that includes the forced data bits when the end of conversion signal has not been generated at the end of the system clock cycle.

14. The method of claim 11 further comprising:
asynchronously clocking the valid counter using the valid signal and synchronously clearing the valid counter using a system clock that defines the system clock cycle;
wherein data bits are converted within the system clock cycle asynchronously to the system clock as valid signals are asynchronously generated.

15. A metastability-hardened analog-to-digital converter (ADC) comprising:
sample means for sampling and holding an analog input to generate a sampled input;
a Digital-to-Analog Converter (DAC) for converting a digital value to a DAC output;
a comparator for comparing the DAC output to the sampled input to generate a compare result;
valid detector means for generating a valid signal when the compare result has reached a threshold, the valid detector means withholding generation of the valid signal when the comparator has a metastable event and the compare result is metastable and has not yet reached the threshold;
a valid counter for generating a valid count, the valid counter sequencing in response to the valid signal;
raw data registers for storing the compare result each time the valid signal is generated; and
data corrector means for generating forced data for bit positions that do not receive a valid signal during conversion, the data corrector means concatenating raw data from the raw data registers for bit positions receiving valid signal with the forced data for bit that do not receive the valid signal during conversion to generate corrected data,
whereby forced data is generated for bit positions that do not receive a valid signal during conversion.

16. The metastability-hardened ADC of claim 15 wherein the data corrector means further comprises:
initial forced bit means for forcing high an initial bit position immediately after a bit position that received a valid signal, wherein the initial bit position did not receive a valid signal;
subsequent forced bit means for forcing low one or more subsequent bit positions after the initial bit position, wherein the subsequent bit positions do not receive a valid signal.

17. The metastability-hardened ADC of claim 16 wherein the valid counter comprises a thermometer-coded shift register that is cleared by a system clock and clocked by the valid signal.

18. The metastability-hardened ADC of claim 15 further comprising:
a sample clock that causes the sample means to sample and hold the analog input;
wherein the valid counter comprises:
a first bit-conversion-counting bistable that is clocked by the valid signal and cleared by the sample clock, the first bit-conversion-counting bistable having an input connected high and generating a first output;
a second bit-conversion-counting bistable that is clocked by the valid signal and cleared by the sample clock, the second bit-conversion-counting bistable having an input connected to the first output and generating a second output;
a third bit-conversion-counting bistable that is clocked by the valid signal and cleared by the sample clock, the third bit-conversion-counting bistable having an input connected to the second output and generating a third output;
a fourth bit-conversion-counting bistable that is clocked by the valid signal and cleared by the sample clock, the fourth bit-conversion-counting bistable having an input connected to the third output and generating a fourth output;
a fifth bit-conversion-counting bistable that is clocked by the valid signal and cleared by the sample clock, the fifth bit-conversion-counting bistable having an input connected to the fourth output and generating a fifth output; and
a final bit-conversion-counting bistable that is clocked by the valid signal and cleared by the sample clock, the final bit-conversion-counting bistable having an input connected to a prior output or a prior bit-conversion-counting bistable and generating a final output.

19. The metastability-hardened ADC of claim 18 further comprising:
wherein the raw data registers comprise:
a first compare result bistable that receives the compare result and is clocked by the first output to generate a first raw data bit;
a second compare result bistable that receives the compare result and is clocked by the second output to generate a second raw data bit;
a third compare result bistable that receives the compare result and is clocked by the third output to generate a third raw data bit;
a fourth compare result bistable that receives the compare result and is clocked by the fourth output to generate a fourth raw data bit;
a fifth compare result bistable that receives the compare result and is clocked by the fifth output to generate a fifth raw data bit; and
a final compare result bistable that receives the compare result and is clocked by the final output to generate a final raw data bit.

20. The metastability-hardened ADC of claim 19 wherein the bistables comprise D-type flip-flops.

* * * * *